US010788910B2

(12) United States Patent
Guo et al.

(10) Patent No.: US 10,788,910 B2
(45) Date of Patent: Sep. 29, 2020

(54) TOUCH SUBSTRATE, METHOD FOR MANUFACTURING THE SAME, AND TOUCH DISPLAY DEVICE

(71) Applicant: BOE Technology Group Co., Ltd., Beijing (CN)

(72) Inventors: Yuanzheng Guo, Beijing (CN); Weinan Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/121,795

(22) Filed: Sep. 5, 2018

(65) Prior Publication Data
US 2019/0227659 A1 Jul. 25, 2019

(30) Foreign Application Priority Data

Jan. 25, 2018 (CN) .......................... 2018 1 0075727

(51) Int. Cl.
G06F 3/041 (2006.01)
H01L 27/32 (2006.01)
G02F 1/1333 (2006.01)

(52) U.S. Cl.
CPC .......... *G06F 3/0412* (2013.01); *G06F 3/0414* (2013.01); *G02F 1/13338* (2013.01); *G06F 2203/04103* (2013.01); *H01L 27/323* (2013.01)

(58) Field of Classification Search
CPC .................. G06F 3/0412; G06F 3/0414; G06F 2203/04103; G02F 1/13338; H01L 27/323
See application file for complete search history.

(56) References Cited

U.S. PATENT DOCUMENTS

| 8,179,381 | B2 | 5/2012 | Frey et al. |
|---|---|---|---|
| 8,384,691 | B2 | 2/2013 | Frey et al. |
| 10,152,185 | B2 | 12/2018 | Tsukamoto |
| 10,303,311 | B2 | 5/2019 | Nakayama et al. |
| 2009/0219257 | A1 | 9/2009 | Frey et al. |
| 2012/0194481 | A1 | 8/2012 | Frey et al. |
| 2015/0212548 | A1* | 7/2015 | Namkung ............. G06F 1/1652 345/174 |
| 2016/0004344 | A1* | 1/2016 | Lee ......................... G06F 3/044 345/174 |

(Continued)

FOREIGN PATENT DOCUMENTS

| CN | 106133660 A | 11/2016 |
|---|---|---|
| CN | 106716253 A | 5/2017 |

(Continued)

OTHER PUBLICATIONS

First Office Action, including Search Report, for Chinese Patent Application No. 201810075727.4, dated Mar. 5, 2020, 14 pages.

*Primary Examiner* — Kent W Chang
*Assistant Examiner* — Andrew Lee
(74) *Attorney, Agent, or Firm* — Westman, Champlin & Koehler, P.A.

(57) ABSTRACT

The present disclosure provides a touch substrate, a method for manufacturing the same, and a touch display device. The touch substrate includes: a substrate, a first base layer arranged on the substrate, and a plurality of first touch electrodes arranged on a side of the first base layer away from the substrate, wherein the first base layer includes a plurality of first grooves, and the first touch electrodes are located in the first grooves.

8 Claims, 9 Drawing Sheets

(56) References Cited

U.S. PATENT DOCUMENTS

| | | | |
|---|---|---|---|
| 2016/0306460 A1* | 10/2016 | Lee | H01L 27/323 |
| 2017/0024040 A1* | 1/2017 | Nakayama | G06F 3/044 |
| 2017/0160837 A1* | 6/2017 | Tsukamoto | G06F 3/041 |
| 2018/0059846 A1* | 3/2018 | Tada | H01Q 1/38 |
| 2019/0212854 A1* | 7/2019 | Noma | G06F 3/044 |

FOREIGN PATENT DOCUMENTS

| | | | | |
|---|---|---|---|---|
| JP | 2011513846 A | | 4/2011 | |
| JP | 2019121311 A | * | 7/2019 | G06F 3/0412 |

\* cited by examiner

C-C'

D-D'

TOUCH SUBSTRATE, METHOD FOR MANUFACTURING THE SAME, AND TOUCH DISPLAY DEVICE

CROSS-REFERENCE TO RELATED APPLICATION

This application claims a priority to Chinese Patent Application No. 201810075727.4 filed on Jan. 25, 2018, the disclosures of which are incorporated in their entirety by reference herein.

TECHNICAL FIELD

The present disclosure relates to the field of touch technology, in particular to a touch substrate, a method for manufacturing the same and a touch display device.

BACKGROUND

Along with the rapid development of display technology, the birth of touch panels (TP) makes people's lives more convenient.

In conventional TP, touch electrodes are made of indium tin oxides (ITO), and are generally patterned by an exposing process. However, since most of materials will be etched by the exposing process, there is a problem that the materials are seriously wasted.

SUMMARY

Embodiments of the present disclosure provide a touch substrate, a method for manufacturing the same, and a touch display device, thus touch electrodes can be formed without using an exposing process.

In order to achieve the above objects, embodiments of the present disclosure adopt the following technical solutions.

In a first aspect, there is provided a touch substrate, including: a substrate, a first base layer arranged on the substrate, and a plurality of first touch electrodes arranged on a side of the first base layer away from the substrate, in which the first base layer includes a plurality of first grooves, and the first touch electrodes are located in the first grooves.

Optionally, the first touch electrodes are located in the first grooves respectively.

Further optionally, an orthogonal projection of each first groove onto the substrate completely overlaps an orthogonal projection of the corresponding first touch electrode onto the substrate.

Optionally, each of the first touch electrodes is made of a material including nano-silver.

Optionally, the first base layer is made of one or more materials selected from the group consisting of polyimide, polyethylene terephthalate, a cyclic olefin copolymer, polymethyl methacrylate and polycarbonate.

Optionally, the first base layer has a thickness in a range from 3 μm to 20 μm.

Optionally, each of the first touch electrodes is of a bulk shape, and the plurality of first touch electrodes is arranged in an array.

Optionally, each of the first touch electrodes extends along a first direction; on this basis, the touch substrate further includes a second base layer arranged on the substrate and a plurality of second touch electrodes arranged on a side of the second base layer away from the substrate; and the second base layer includes a plurality of second grooves, in which the second touch electrodes are located in the second grooves respectively; each of the second touch electrodes extends in a second direction; and the first direction intersects the second direction; and the second touch electrodes are made of a same material as the first touch electrodes.

In a second aspect, there is provided a touch display device, including the touch substrate of the first aspect.

Optionally, the touch display device further includes a display panel which is arranged on a light emitting side of the display panel.

Optionally, the display panel is an organic light-emitting diode (OLED) display panel or a flexible liquid crystal display (LCD) panel.

In a third aspect, there is provided a method for manufacturing a touch substrate, including: forming an insulating film on a substrate; forming, through pressing, a plurality of grooves in a surface of the insulating film to form a first base layer intermediate, each first touch electrode to be formed being located in a corresponding groove; curing the first base layer intermediate to enable each of the grooves to be formed into a first groove, so as to obtain a first base layer; and forming the first touch electrodes in the first grooves of the first base layer.

Optionally, the first touch electrodes are located in the first grooves respectively.

Optionally, each of the first touch electrodes is made of a material including nano-silver.

Optionally, the forming the insulating film on the substrate and the forming, through pressing, the plurality of grooves in the surface of the insulating film to form the first base layer intermediate includes: forming the insulating film on the substrate through a coating process; removing 40% to 80% of a solvent from the insulating film through evaporation; and forming, through pressing, the plurality of grooves in the surface of the insulating film to form the first base layer intermediate, wherein each first touch electrode to be formed is located in the corresponding groove.

Optionally, the curing the first base layer intermediate includes: removing 90% or more of the solvent from the first base layer intermediate through evaporation.

Optionally, the forming the first touch electrodes in the first grooves of the first base layer includes: forming the first touch electrodes in the first grooves of the first base layer through a solution process.

Further optionally, the solution process includes an ink-jet printing or a printing process.

Optionally, the method further includes: forming a second base layer and a plurality of second touch electrodes by using the method for forming the first base layer and the first touch electrodes, wherein the second base layer includes a plurality of second grooves, and the second touch electrodes are located in the second grooves respectively; and the second touch electrodes are made of a same material as the first touch electrodes.

BRIEF DESCRIPTION OF THE DRAWINGS

In order to illustrate the technical solutions of the present disclosure or the related technology in a clearer manner, the drawings desired for the present disclosure or the related technology will be briefly hereinafter briefly. Obviously, the following drawings merely illustrate some embodiments of the present disclosure. Based on these drawings, a person skilled in the art may obtain the other drawings without any creative effort.

FIG. 1b is a sectional view along line A-A' of FIG. 1a.

FIG. 2b is a sectional view along line B-B' of FIG. 2a.

FIG. 4b is a sectional view along line C-C' of FIG. 4a.

FIG. 5a is a first schematic view of forming the first grooves on the basis of FIG. 4a.

FIG. 5b is a sectional view along line D-D' of FIG. 5a.

FIG. 6a is a second schematic view of forming the first grooves on the basis of FIG. 4a.

FIG. 6b is a sectional view along line E-E of FIG. 6a.

FIG. 7a is a schematic view of forming the first touch electrodes in the first grooves on the basis of FIG. 6a.

FIG. 7b is a sectional view along line F-F' of FIG. 7a.

FIG. 8a is a top view of forming a nano-silver layer on the first groove side of the first base layer on the basis of FIG. 5a.

FIG. 8b is a sectional view along line G-G' of FIG. 8a.

DETAILED DESCRIPTION

Figure 1A:
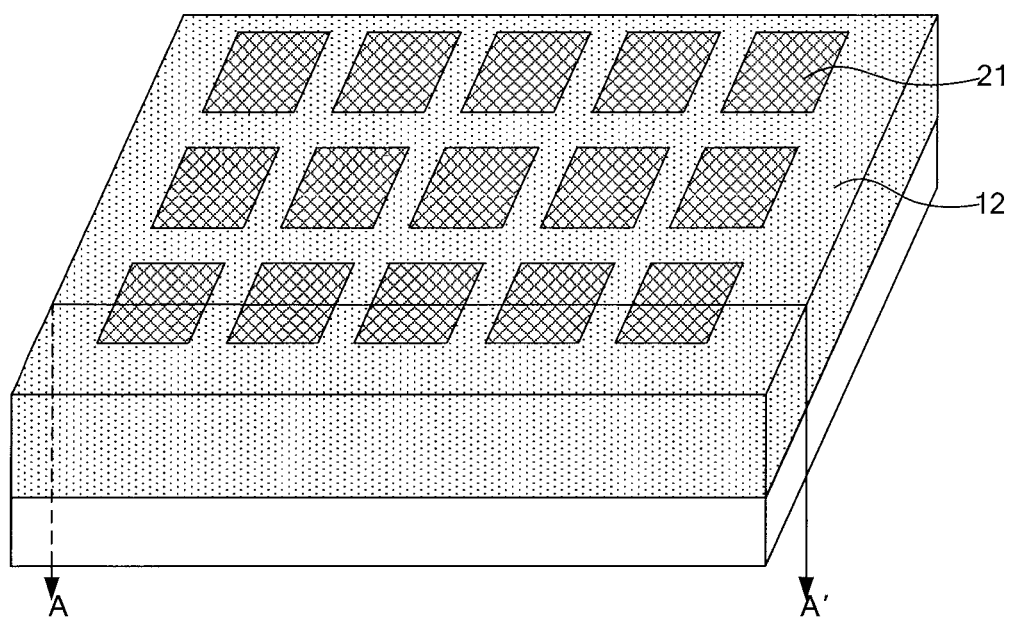
FIG. 1a is a schematic diagram of a first base layer and first touch electrodes on a touch substrate according to one embodiment of the present disclosure.

The technical solutions in the embodiments of the present disclosure will be described hereinafter in conjunction with the drawings in the embodiments of the present disclosure in a clear and complete manner. Obviously, the following embodiments merely relate to a part of, rather than all of, the embodiments of the present disclosure. Based on these embodiments, a person skilled in the art may, without any creative effort, obtain the other embodiments, which also fall within the scope of the present disclosure.

One embodiment of the present disclosure provide a touch substrate, as shown in FIGS. 1a and 1b, or FIGS. 2a and 2b. The touch substrate includes a substrate, a first base layer 12 arranged on the substrate, and a plurality of first touch electrodes 21 arranged on a side of the first base layer 12 away from the substrate. The first base layer 12 includes a plurality of first grooves 11, and the first touch electrodes 21 are located in the first grooves 11 respectively.

It should be noted that the shape of the first touch electrode 21 may be determined according to a specific touch mode. The touch mode includes a self-capacitance mode and a mutual-capacitance mode. Correspondingly, the shape of the first groove 11 may be determined according to the shape of the first touch electrode 21 therein.

Further, the substrate may be a glass substrate, a plastic substrate, or the like. On this basis, before the first base layer 12 is formed, other film layers or patterns may be formed or not formed on the substrate.

One embodiment of the present disclosure provides a touch substrate, by providing a first base layer 12 having a plurality of first grooves 11, and by allowing the first touch electrodes 21 to be located in the first grooves 11 respectively, and thus by combining with a corresponding process (for example, ink-jet printing or printing, etc.), the first touch electrodes 21 may be formed in the first grooves 11 without using an exposing process, thereby reducing the cost.

Optionally, as shown in FIGS. 1a and 1b, or FIGS. 2a and 2b, the first touch electrodes 21 are located in the first grooves 11 respectively. Further, an orthogonal projection of each first groove 11 onto the substrate completely overlaps an orthogonal projection of the corresponding first touch electrode 21 onto the substrate.

Thus, according to the shape and size of the first touch electrode 21, it merely need to control the shape and size of the first groove 11, so as to form the first touch electrode 21 having corresponding shape and size.

On this basis, in order to ensure a flat surface, the thickness of the first touch electrode 21 may be made equal to the depth of the first groove 11.

Optionally, the first touch electrode 21 is made of a material including nano-silver. A nano-silver material is used for the first touch electrode, and may substitute ITO, thereby meet the requirements for curved or flexible products.

Of course, the first touch electrode 21 may also be made of a material of graphene, a carbon nanotube or the like.

Optionally, the first base layer 12 may be made of one or more materials selected from the group consisting of polyimide (PI), polyethylene terephthalate (PET), a cyclic olefin copolymer (COP), a polymethyl methacrylate (PMMA), and polycarbonate (PC). Since PI is stable in terms of performance and has a high temperature resistant, it is preferable that the first base layer 12 is made of a material of PI.

Thus, a coating process may be employed to form an insulating film, so that the first grooves 11 may be relatively easily formed in the surface of the insulating film in the process, thereby forming the first base layer 12.

Optionally, the first base layer 12 has a thickness in a range from 3 μm to 20 μm. On the basis of ensuring that the first grooves 11 may be formed, it is possible to avoid the light emission rate being affected by too thick first base layer 12.

Optionally, the first groove 11 may have a depth in a range from 1 μm to 5 μm.

Figure 1B:
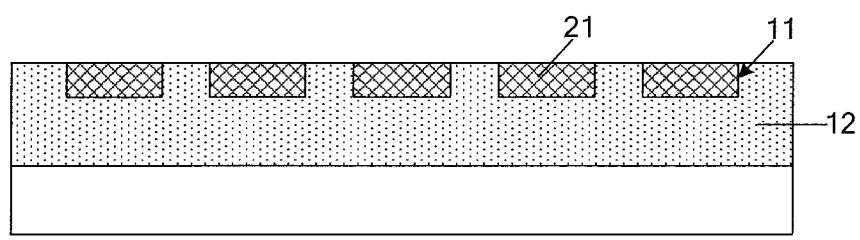

Optionally, as shown in FIGS. 1a and 1b, the first touch electrode 21 is of a bulk shape, and the plurality of first touch electrodes 21 is arranged in an array. That is, the first touch electrode 21 performs touch recognition based on a self-capacitance mode.

Figure 2A:
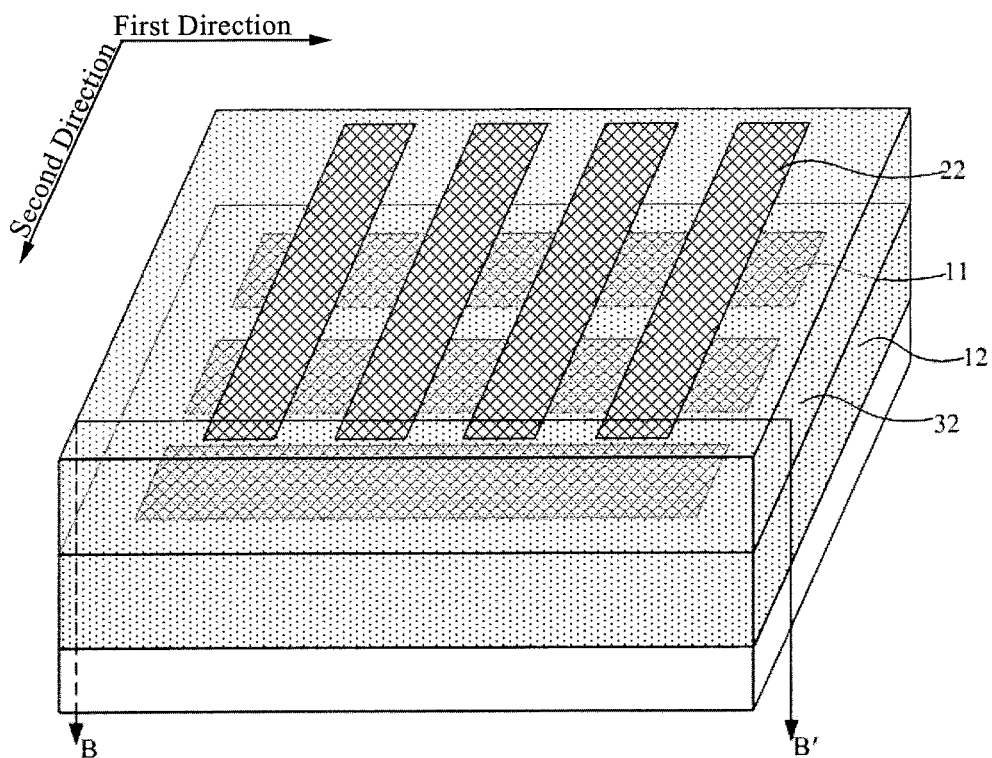
FIG. 2a is a schematic diagram of a first base layer, first touch electrodes, a second base layer, and second touch electrodes on a touch substrate according to one embodiment of the present disclosure.
Figure 2B:
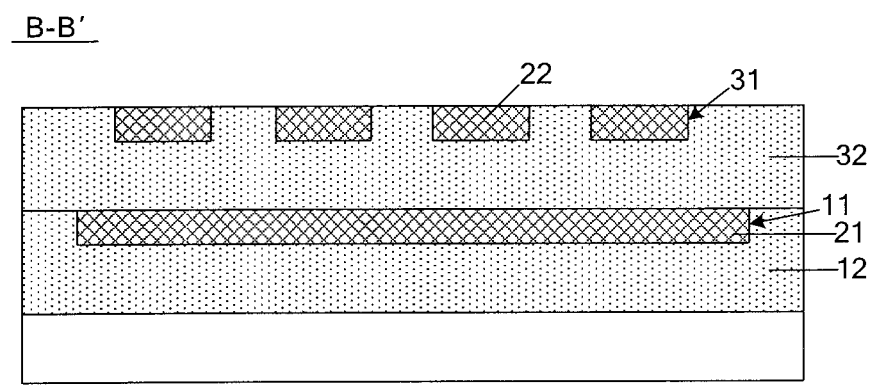

Optionally, as shown in FIGS. 2a and 2b, the first touch electrodes 21 extend along the first direction. The touch substrate further includes a second base layer 32 arranged on the substrate, and a plurality of second touch electrodes 22 arranged on a side of the second base layer 32 away from the substrate. The second base layer 32 includes a plurality of second grooves 31, the second touch electrodes 22 are located in the second grooves 31 respectively. Each of the second touch electrodes 22 extends along a second direction. The first direction intersects the second direction. The second touch electrodes 22 are made of the same material as the first touch electrode 21.

Illustratively, the first touch electrode 21 and the second touch electrode 22, as shown in FIG. 2a, may be of a strip shape or may be of a grid shape. Of course, the first touch electrode 21 and the second touch electrode 22 may be of other shapes as long as the touch position may be accurately recognized.

Based on this, the first touch electrode 21 and the second touch electrode 22 perform touch recognition based on a mutual-capacitance mode.

Optionally, the second base layers 32 are made of one or more materials selected from the group consisting of PI, PET, a COP, a PMMA, and PC.

The second base layer 32 has a thickness in a range from 3 μm to 20 μm. The second groove 31 may have a depth in a range from 1 μm to 5 μm.

One embodiment of the present disclosure further provides a touch display device including the above touch substrate. The touch display device has the same beneficial effects as the touch substrate.

Optionally, the touch display device further includes a display panel. The display panel may be an OLED display panel or a flexible LCD display panel. The display panel is more advantageous for the touch display device to realize flexibility, curved surface and the like.

Illustratively, the touch substrate may be arranged on a light emitting side of the display panel. Thus, when the touch substrate is manufactured, there is no need to consider the influence of the process temperature on the structure in the display panel.

Figure 3:
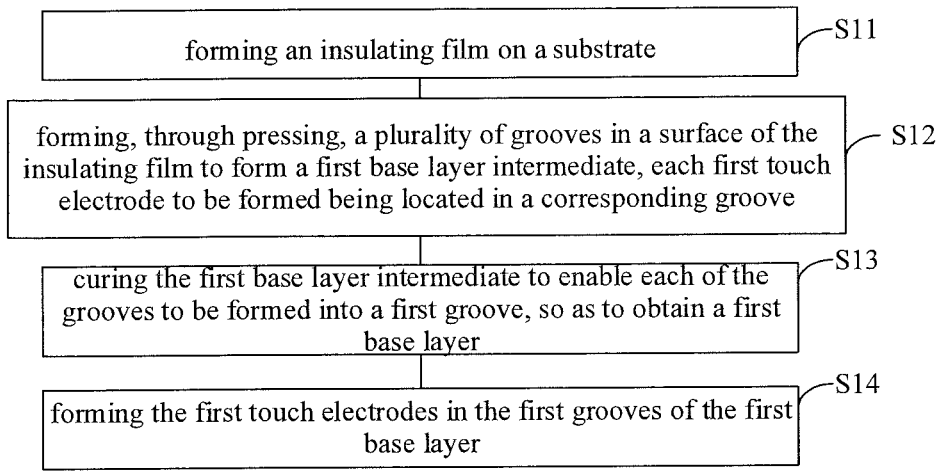
FIG. 3 is a first flow chart of a method for manufacturing a touch substrate according to one embodiment of the present disclosure.

One embodiment of the present disclosure further provides a method for manufacturing a touch substrate, as shown in FIG. 3, the method includes the following steps.

Figure 4A:
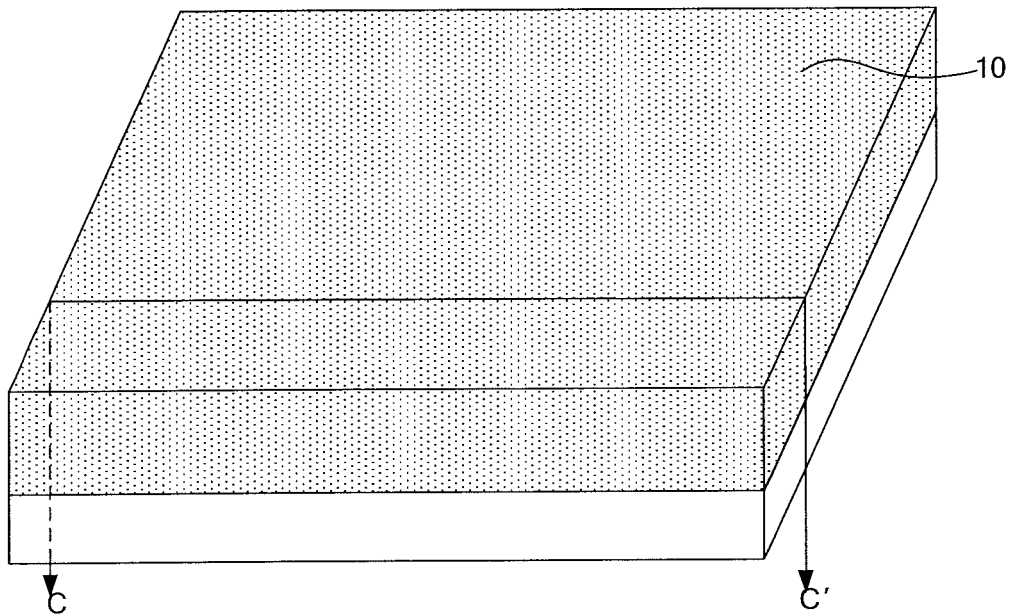
FIG. 4a is a schematic view of forming an insulating film on a substrate.
Figure 4B:
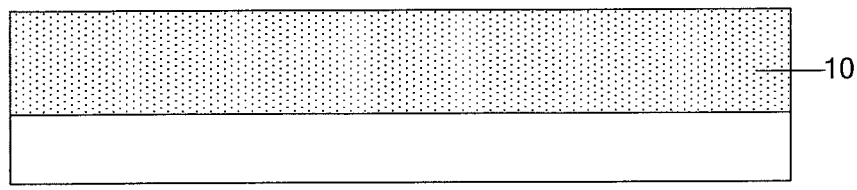

S11: forming an insulating film 10 on a substrate, as shown in FIGS. 4a and 4b.

Illustratively, the insulating film is a transparent insulating film. The word "transparent" herein may be understood as a transmission rate between 60% and 100%. The insulating film 10 may be made of a material including an organic resin. Illustratively, the insulating film 10 may be made of one or more materials selected from the group consisting of PI, a polyamic acid, PET, a COP, a PMMA and PC.

It should be noted that, in selecting the material of the insulating film 10, the process of forming the insulating film 10 should be combined, and the pattern of the desired groove may be formed, through pressing, by a mold in S12 without affecting other structures.

Further, the substrate may be a glass substrate, a plastic substrate, or the like. On this basis, before the insulating film 10 is formed, other film layers or patterns may be formed or not formed on the substrate.

S12: forming, through pressing, a plurality of grooves in a surface of the insulating film 10 to form a first base layer intermediate, each first touch electrode to be formed being located in a corresponding groove.

Specifically, a mold may be used for forming, through pressing, a plurality of grooves in a surface of the insulating film 10 to form the first base layer intermediate, in which each first touch electrode to be formed is located in the corresponding groove.

Optionally, the mold may have protrusions located in the grooves respectively. The protrusions of the mold were brought proximate to and pressed on the insulating film 10, to form a groove at a predetermined position, thereby forming the insulating film 10 as the first base layer intermediate.

S13: curing the first base layer intermediate to enable each of the grooves to be formed into a first groove 11, so as to obtain a first base layer 12, as shown in FIGS. 5a and 5b or FIG. 6a or 6b.

It should be noted that a person skilled in the art would understand that the first base layer intermediate differs from the first base layer 12 in that the shapes of the first base layer 12 and the first groove 11 are completely fixed after curing.

As compared with the groove on the first base layer intermediate, the size of the first grooves 11 obtained after curing may be slightly smaller than the size of the grooves on the first base layer intermediate, but the shapes of the grooves on the first base layer intermediate and the first grooves 11 do not substantially change.

Optionally, according to the material used for the insulating film 10, if a soluble material such as soluble PI is used for the insulating film 10, no chemical reaction occurs in the curing process, and only the solvent is removed through evaporation. On the other hand, if the material used for the insulating film 10 is a material that cannot be directly dissolved, for example, polyamic acid, a precursor of PI, a chemical reaction occurs in the curing process, that is, during and after removing the solvent through evaporation, the polyamic acid undergoes a chemical reaction, and is dehydrated and condensed to form a polyimide.

S14: forming the first touch electrodes in the first grooves of the first base layer, as shown in FIGS. 1a and 1b or FIGS. 7a and 7b.

Optionally, the first touch electrodes 21 are located in the first grooves 11 respectively.

The shape of the first touch electrode 21 may be determined according to a specific touch mode. The touch mode includes a self-capacitance mode and a mutual-capacitance mode. Based on this, according to the shape of the first touch electrode 21, the protrusion of the corresponding mold is designed, such that the shape of the first touch electrode 21 formed in the first groove 11 is a desired shape.

One embodiment of the present disclosure provides a method for manufacturing a touch substrate, by forming a first base layer 12 having a plurality of first grooves 11, and by allowing each of the plurality of the first touch electrodes 21 to be located in each of the plurality of the first grooves 11, and thus by combining with a corresponding process (for example, ink-jet printing or printing, etc.) the first touch electrode 21 may be formed in the first groove 11 without using an exposing process, thereby reducing the cost.

Optionally, the first touch electrode 21 is made of a material including nano-silver. A nano-silver material is used for the first touch electrode, and may substitute ITO, thereby meet the requirements for curved or flexible products.

Optionally, the above S11 and S12 may be specifically performed by the following steps.

S111: forming the insulating film on the substrate by a coating process.

A person skilled in the art should understand that the insulating film 10 is formed by a coating process, that is, a solution containing an insulating material is coated on the substrate to form the insulating film 10.

The insulating film 10 may be made of one or more materials selected from the group consisting of PI, a polyamic acid, PET, a COP, a PMMA and PC. The insulating film 10 may have a thickness in a range from 3 μm to 20 μm.

S121: removing 40% to 80% of a solvent from the insulating film through evaporation.

Specifically, the substrate formed with the insulating film may be placed into a drying equipment, to remove 40% to 80% of the solvent from the insulating film through evaporation. The drying equipment may specifically be a high thermal and reduced pressure drying equipment.

When 40% to 80% of the solvent in the insulating film 10 is removed, the surface of the insulating film 10 is completely dried. The range from 40% to 80% is selected for the following reasons: if the value is more than 80%, the insulating film 10 is too hard and is not easily to be pressed to form grooves later; and if the value is less than 40%, the shape of the grooves may be easily fixed after the grooves are pressed.

S122: forming, through pressing, the plurality of grooves in the surface of the insulating film 10 to form the first base layer intermediate, wherein each first touch electrode to be formed is located in the corresponding groove.

In one embodiment of the present disclosure, the insulating film 10 is formed through a coating process, and after the insulating film 10 is dried to a certain extent, the grooves may be formed relatively easily into grooves by die pressing, and the shape of the grooves may be fixed.

On this basis, the curing the first base layer intermediate in S13 may be specifically achieved by the following manner, including: removing 90% or more of the solvent from the first base layer intermediate through evaporation.

When 90% or more of the solvent in the first base layer intermediate is removed through evaporation, the substrate on which the first base layer intermediate is formed may be placed in a drying equipment or in an oven to remove the solvent from the first base layer intermediate through evaporation.

Optionally, the above S14 may be implemented in the following manners.

In manner I, the first touch electrodes 21 are formed in the first grooves 11 of the first base layer 12 through an ink-jet printing process.

Specifically, the first touch electrodes 21 may be formed in the first grooves 11 of the first base layer 12 by ink-jet printing a nano-silver paste.

In manner II, the first touch electrodes 21 are formed in the first grooves 11 of the first base layer 12 by a printing process.

Specifically, the ink containing the nano-silver may be filled into the first grooves 11 by printing in the first grooves 11 of the first base layer 12, and the first touch electrodes 21 are formed after curing and forming.

The manner I and the manner II belong to the solution process.

In manner III, a nano-silver layer is formed on the whole surface of the first base layer 12, and etched to remove a certain thickness of the nano-silver layer; and the nano-silver layer in the first grooves 11 is exposed to form the first touch electrodes 21.

Figure 8A:
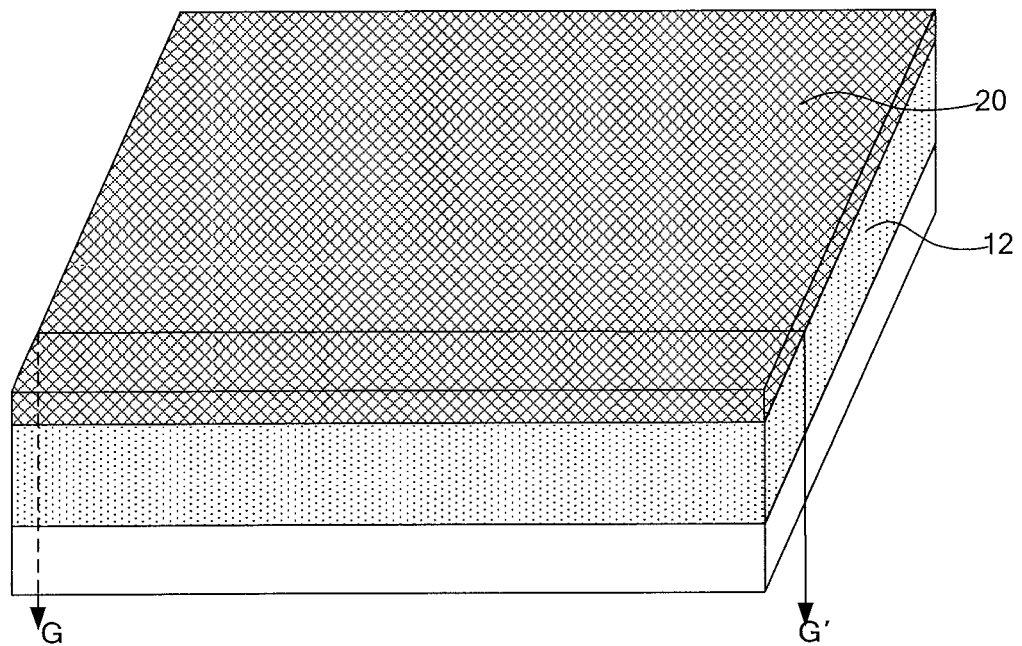
Figure 8B:
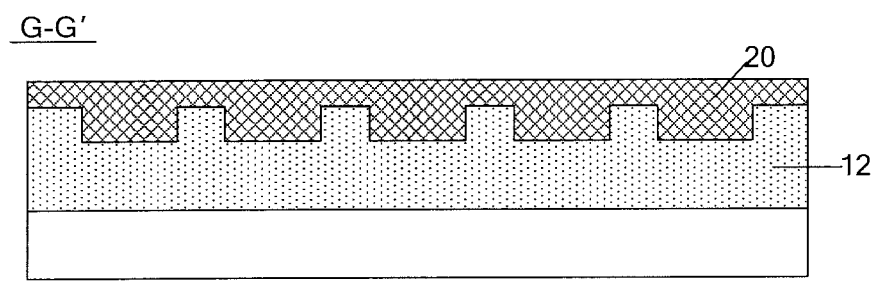

Specifically, a solution of a nano-silver is coated on the surface of the first base layer 12 having the first grooves 11, and a nano-silver layer 20 is formed after drying and curing (as shown in FIGS. 8a and 8b). Thereafter, ashing is performed, and the entire surface is etched to remove a certain thickness of nano-silver layer 20; and the nano-silver layer 20 in the first grooves 11 is exposed to form the first touch electrodes 21 (refer to FIGS. 1a and 1b).

Since the thickness of the nano-silver layer 20 at the position of each first groove 11 is thicker than that of other positions, the silver paste that is not located in the first grooves 11 may be completely etched by selecting a suitable etching depth, and thus only the nano-silver layer 20 in each first groove 11 is retained to form the first touch electrode 21. The thickness of the first touch electrode 21 is preferably equal to the depth of each first groove 11.

Illustratively, if the thickness of the nano-silver layer 20 at the position of the first groove 11 is A+B and the thickness of the nano-silver layer 20 at other positions is A, by etching, the nano-silver layer 20 of the thickness A is etched away by etching, thereby retaining the nano-silver layer 20 of thickness B within the first groove 11. It may be understood that the depth of the first groove 11 is B.

For the above manners I, II and III, the exposing process is not required, and the process is relatively simple. As compared with the traditional exposing process, the manners I and II may greatly improve the utilization rate of the material, thereby further reducing the cost.

Based on the above description, optionally, as shown in FIGS. 1a and 1b, the first touch electrode 21 is of a bulk shape, and the plurality of first touch electrodes 21 is arranged in an array. That is, the first touch electrode 21 performs touch recognition based on a self-capacitance mode.

Optionally, as shown in FIGS. 2a and 2b, the method further includes: forming a second base layer 32 and a plurality of second touch electrodes 22 on the substrate, by using the method for forming the first base layer 12 and the first touch electrode 21. The second base layer 32 includes a plurality of second grooves 31, the second touch electrode 22 are located in the second grooves 31, and each of the plurality of the second touch electrodes 22 is located in each of the plurality of the second grooves 31. The second touch electrodes 22 are made of a same material as the first touch electrodes 21.

Specifically, the first touch electrode 21 may extend along the first direction; and the second touch electrode may extend along the second direction, in which the first direction intersects with the second direction.

The first touch electrode 21 and the second touch electrode 22 may be of a strip shape or may be of a grid shape.

Based on this, the first touch electrode 21 and the second touch electrode 22 perform touch recognition based on a mutual-capacitance mode.

It should be noted that the second base layer 32 may be formed and the second touch electrodes 22 may be formed in the second grooves 31 of the second base layer 32, by any of the above methods for forming the first base layer 12 and the first touch electrodes 21.

In addition, FIGS. 2a to 2b illustratively show that the first base layer 12 is in contact with the second base layer 32, but the present disclosure is not limited thereto.

Two embodiments are provided below to specifically describe a method for manufacturing two touch substrates.

Figure 9:
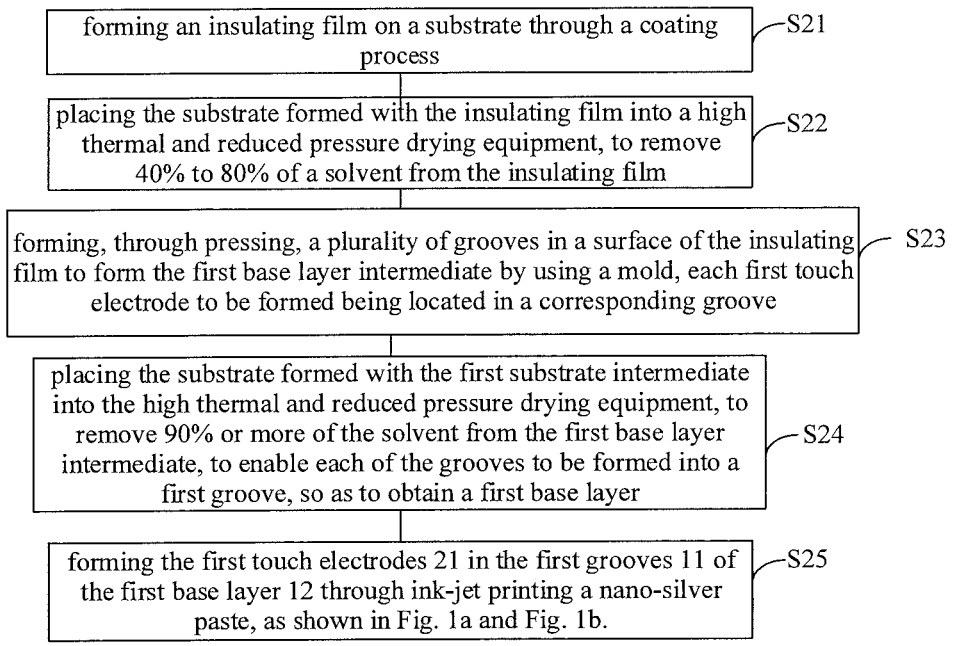
FIG. 9 is a second flow chart of a method for manufacturing a touch substrate according to one embodiment of the present disclosure.

In an embodiment, there is provided a method for manufacturing a touch substrate based on a self-capacitance mode, as shown in FIG. 9, the method includes the following steps.

S21: forming an insulating film 10 on a substrate by a coating process, as shown in FIGS. 4a and 4b.

Illustratively, the insulating film 10 may be made of a material of PI.

S22: placing the substrate formed with the insulating film into a high thermal and reduced pressure drying equipment, to remove 40% to 80% of a solvent from the insulating film 10.

S23: forming, through pressing, a plurality of grooves in a surface of the insulating film 10 to form the first base layer intermediate by using a mold, each first touch electrode 21 to be formed being located in a corresponding groove.

Illustratively, each groove is of a bulk shape and all the grooves are arranged in an array.

Figure 5A:
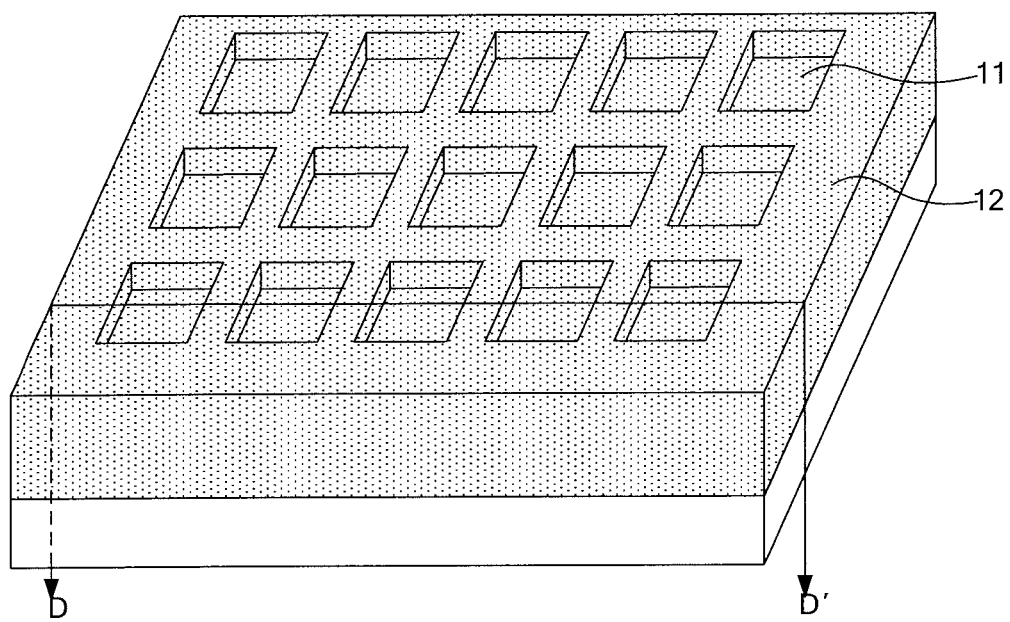
Figure 5B:
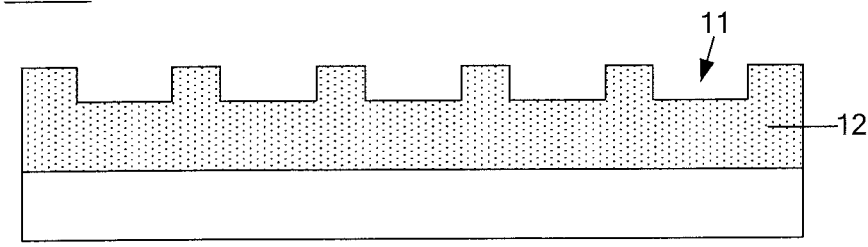

S24: placing the substrate formed with the first substrate intermediate into the high thermal and reduced pressure drying equipment, to remove 90% or more of the solvent from the first base layer intermediate, to enable each of the grooves to be formed into a first groove 11, so as to obtain a first base layer 12 as shown in FIGS. 5a and 5b.

S25: forming the first touch electrodes 21 in the first grooves 11 of the first base layer 12 through ink-jet printing a nano-silver paste, as shown in FIG. 1a and FIG. 1b.

This embodiment of the present disclosure provides a touch substrate, a method for manufacturing the same, and a touch display device, by forming a first base layer having a plurality of first grooves on the substrate, and by allowing each of the plurality of the first touch electrodes to be located in each of the plurality of the first grooves, and thus by combining with a corresponding process (for example, ink-jet printing or printing, etc.) the first touch electrode may be formed in the first groove without using an exposing process, thereby reducing the cost.

Figure 10:
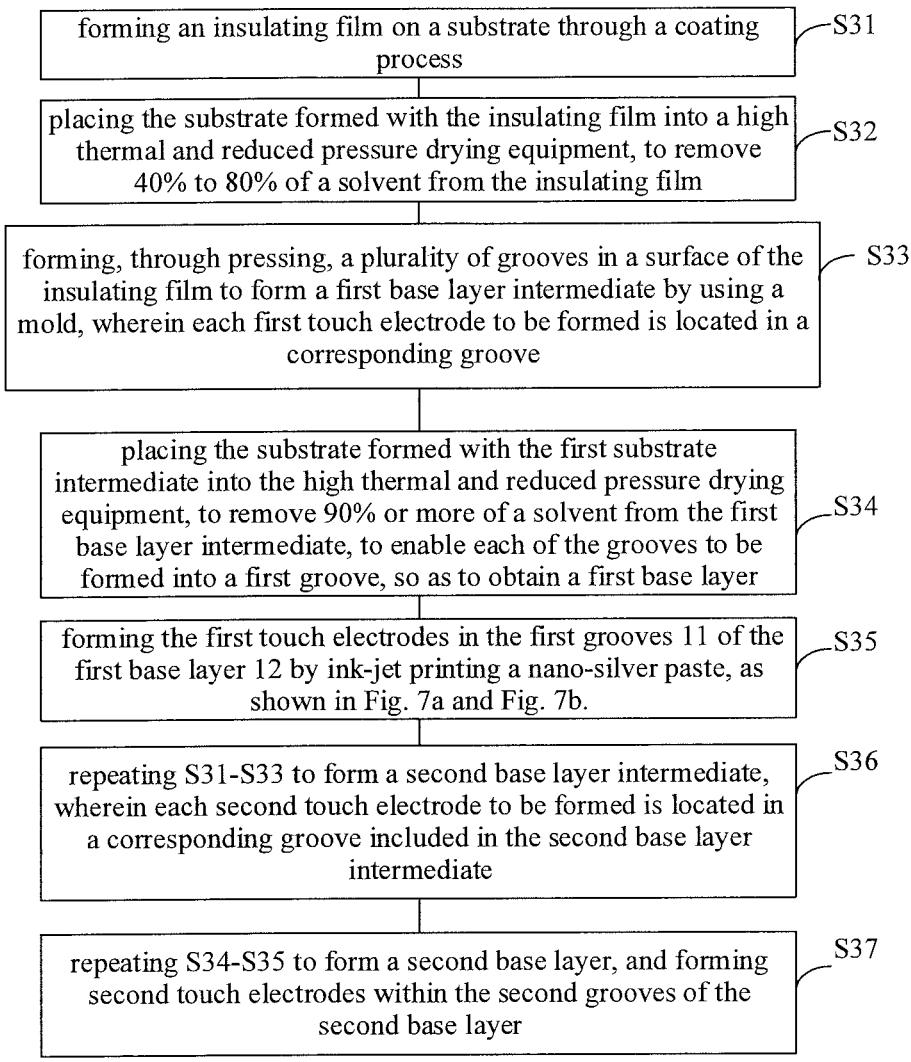
FIG. 10 is a third flow chart of a method for manufacturing a touch substrate according to one embodiment of the present disclosure.

In an another embodiment, there is provided a method for manufacturing a touch substrate based on a mutual-capacitance mode, as shown in FIG. 10, the method includes the following steps.

S31: forming an insulating film 10 on a substrate through a coating process, as shown in FIGS. 4a and 4b.

Illustratively, the insulating film 10 may be made of a material of PI.

S32: placing the substrate formed with the insulating film into a high thermal and reduced pressure drying equipment, to remove 40% to 80% of the solvent from the insulating film 10.

S33: forming, through pressing, a plurality of grooves in a surface of the insulating film 10 to form a first base layer intermediate by using a mold, wherein each first touch electrode 21 to be formed is located in a corresponding groove.

Illustratively, each of the grooves is of a strip shape, and all the grooves are arranged in parallel and extend along the first direction.

Figure 6A:
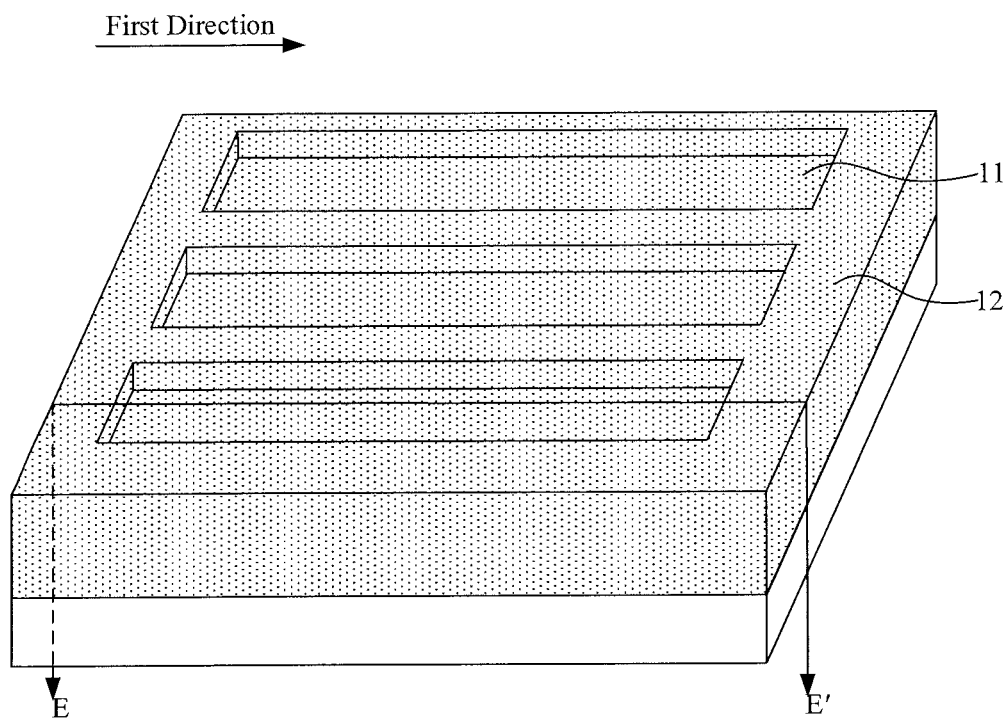
Figure 6B:
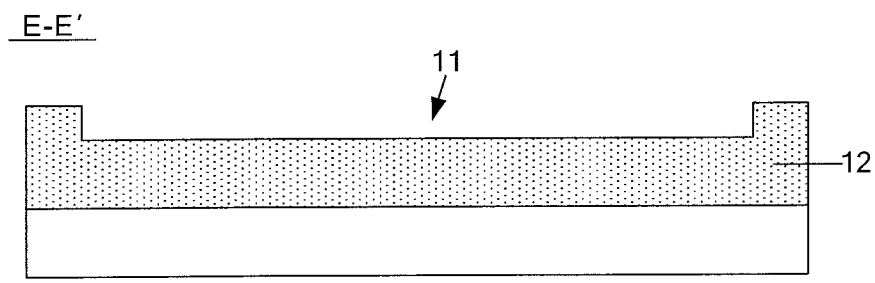

S34: placing the substrate formed with the first substrate intermediate into the high thermal and reduced pressure drying equipment, to remove 90% or more of the solvent from the first base layer intermediate, to enable each of the grooves to be formed into a first groove 11, so as to obtain a first base layer 12 as shown in FIGS. 6a and 6b.

Figure 7A:
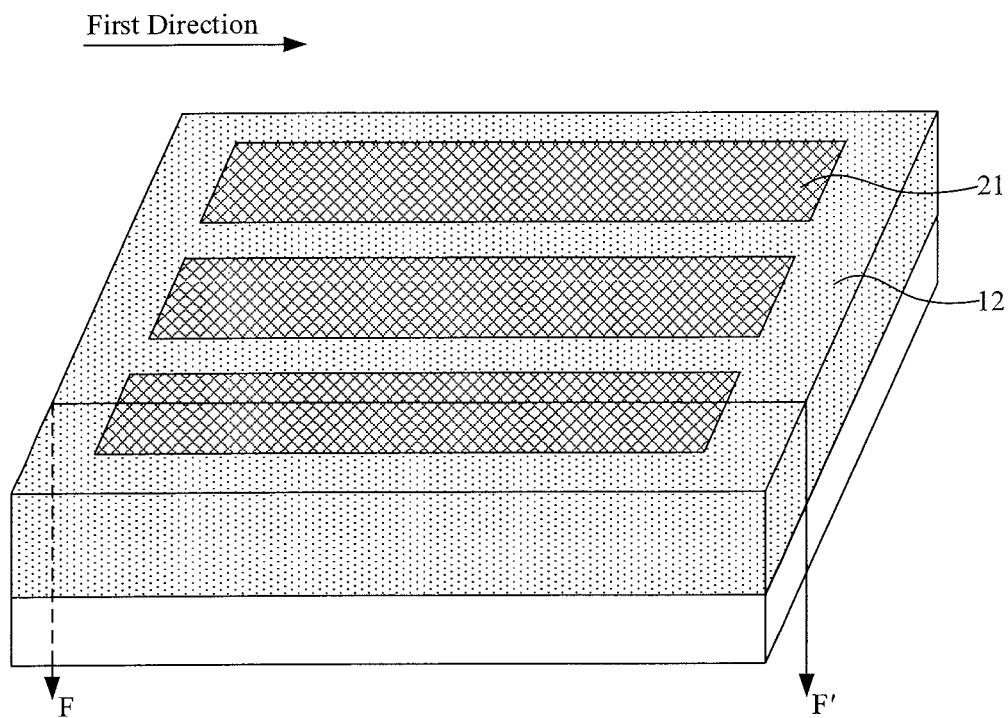
Figure 7B:
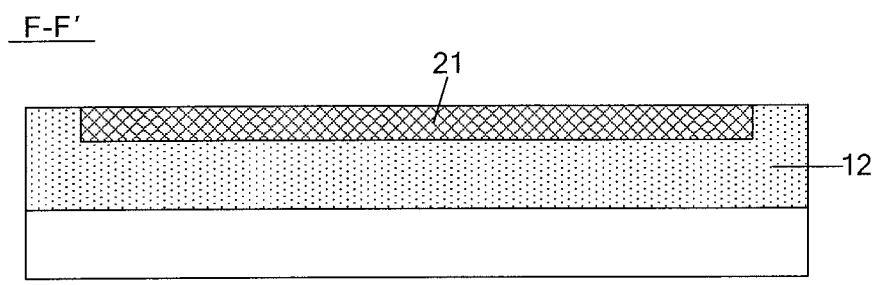

S35: forming the first touch electrodes in the first grooves 11 of the first base layer 12 by ink-jet printing a nano-silver paste, as shown in FIG. 7a and FIG. 7b.

S36: repeating S31-S33 to form a second base layer intermediate, wherein each second touch electrode to be formed is located in a corresponding groove included in the second base layer intermediate.

Illustratively, each of the grooves of the second substrate intermediate is of a strip shape, extends along the second direction, and the grooves are arranged in parallel.

S37: repeating S34-S35 to form a second base layer 32, and forming second touch electrodes 22 within the second grooves 31 of the second base layer 32 as shown in FIGS. 2a and 2b.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A method for manufacturing a flexible touch display device comprising a flexible display panel and a touch substrate arranged on a light emitting side of the flexible display panel, the method comprising:

forming an insulating film on a substrate through a coating process, wherein a material of the insulating film comprises one or more materials selected from the group consisting of polyethylene terephthalate, cyclic olefin copolymer, polymethyl methacrylate and polycarbonate, or a precursor of polyethylene terephthalate, cyclic olefin copolymer, polymethyl methacrylate and polycarbonate;

removing 40% to 80% of a solvent from the insulating film through evaporation;

forming, through pressing, a plurality of grooves in a surface of the insulating film to form a first base layer intermediate, each first touch electrode to be formed being located in a corresponding groove;

curing the first base layer intermediate to enable each of the grooves to be formed into a first groove, so as to obtain a first base layer, wherein the shapes of the first base layer and the first groove are completely fixed after curing, the size of the first grooves is slightly smaller than the size of the grooves on the first base layer intermediate, the shapes of the grooves on the first base layer intermediate and the first grooves are substantially the same, the first base layer has a thickness in a range from 3 μm to 20 μm, the first groove has a depth in a range from 1 μm to 5 μm, and the first base layer is made of one or more materials selected from the group consisting of polyethylene terephthalate, cyclic olefin copolymer, polymethyl methacrylate and polycarbonate; and forming the first touch electrodes in the first grooves of the first base layer, wherein the first touch electrode is made of a material of graphene or a carbon nanotube; and the method further comprising:

forming an insulating film on a substrate through a coating process, removing 40% to 80% of a solvent from the insulating film through evaporation; and forming, through pressing, the plurality of grooves in the surface of the insulating film to form the first base layer intermediate, wherein each first touch electrode to be formed is located in the corresponding grooves;

curing the second base layer intermediate to enable each of the grooves to be formed into a second groove, so as to obtain a second base layer, wherein the shapes of the second base layer and the second groove are completely fixed after curing, the size of the second grooves is slightly smaller than the size of the grooves on the second base layer intermediate, the shapes of the grooves on the second base layer intermediate and the second grooves are substantially the same, the second base layer has a thickness in a range from 3 μm to 20 μm, the second groove has a depth in a range from 1 μm to 5 μm, and the second base layer is made of one or more materials selected from the group consisting of polyethylene terephthalate, cyclic olefin copolymer, polymethyl methacrylate and polycarbonate;

forming the second touch electrodes in the second grooves of the second base layer, wherein the second touch electrodes are made of a same material as the first touch electrode.

2. The method of claim 1, wherein the first touch electrodes are located in the first grooves respectively.

3. The method of claim 1, wherein the curing the first base layer intermediate comprises:

removing 90% or more of a solvent from the first base layer intermediate through evaporation.

4. The method of claim 1, wherein the forming the first touch electrodes in the first grooves of the first base layer comprises:
   forming the first touch electrodes in the first grooves of the first base layer through a solution process.

5. The method of claim 4, wherein the solution process comprises an ink-jet printing or a printing process.

6. The method of claim 2, wherein an orthogonal projection of each first groove onto the substrate completely overlaps an orthogonal projection of the corresponding first touch electrode onto the substrate.

7. The method of claim 1, wherein each of the first touch electrodes is of a bulk shape, and the plurality of first touch electrodes are arranged in an array.

8. The method of claim 1, wherein the flexible display panel is an organic light-emitting diode (OLED) display panel or a flexible liquid crystal display (LCD) panel.

* * * * *